United States Patent
Wu et al.

(10) Patent No.: US 10,950,455 B2
(45) Date of Patent: Mar. 16, 2021

(54) METHOD FOR MANUFACTURING A SEMICONDUCTOR DEVICE AND SEMICONDUCTOR DEVICE

(71) Applicant: Robert Bosch GmbH, Stuttgart (DE)

(72) Inventors: Zhenyu Wu, Metzingen (DE); Jens Schindele, Kirchentellinsfurt (DE); Torsten Kramer, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/572,950

(22) Filed: Sep. 17, 2019

(65) Prior Publication Data

US 2020/0090942 A1  Mar. 19, 2020

(30) Foreign Application Priority Data

Sep. 18, 2018  (DE) .......................... 102018215793.6

(51) Int. Cl.
| | |
|---|---|
| *H01L 21/308* | (2006.01) |
| *H01L 21/027* | (2006.01) |
| *B81C 1/00* | (2006.01) |
| *H01L 21/263* | (2006.01) |
| *H01L 21/3105* | (2006.01) |

(52) U.S. Cl.
CPC ...... *H01L 21/3081* (2013.01); *H01L 21/0274* (2013.01); *H01L 21/2633* (2013.01); *H01L 21/31056* (2013.01)

(58) Field of Classification Search
None
See application file for complete search history.

(56) References Cited

U.S. PATENT DOCUMENTS

| | | | | |
|---|---|---|---|---|
| 6,942,814 B2* | 9/2005 | Wood | ................. | G02B 26/0841 |
| | | | | 216/17 |
| 7,947,589 B2* | 5/2011 | Muralidhar | ......... | H01L 21/3086 |
| | | | | 438/585 |
| 8,422,702 B2* | 4/2013 | Kim | ..................... | H04R 19/005 |
| | | | | 381/174 |
| 2008/0242052 A1 | 10/2008 | Feng | | |
| 2013/0049116 A1* | 2/2013 | Zhu | ..................... | H01L 27/1203 |
| | | | | 257/347 |
| 2013/0099349 A1* | 4/2013 | Nomachi | ............ | H01L 21/3213 |
| | | | | 257/506 |
| 2014/0306301 A1* | 10/2014 | Xie | ......................... | B41J 2/162 |
| | | | | 257/419 |

* cited by examiner

*Primary Examiner* — Shamim Ahmed
(74) *Attorney, Agent, or Firm* — Norton Rose Fulbright US LLP; Gerard Messina

(57) ABSTRACT

A method for manufacturing a semiconductor device in which a semiconductor substrate is provided, including a SOI-wafer having a carrier layer defining a rear side, a functional layer defining a front side. An insulation layer is situated between the carrier layer and functional layer. The functional layer includes a functional area having functional structures. The front side is masked, a first mask opening defines an interior area containing the functional area. The functional layer is removed by etching the front side. The rear side is masked, a second mask opening being configured, and a circumferential edge of the second mask opening is spaced outwardly relative to an outer circumferential edge of the interior area. The carrier layer and the insulation layer are removed at least in the area of the second-mask opening by etching to expose the interior area.

11 Claims, 8 Drawing Sheets

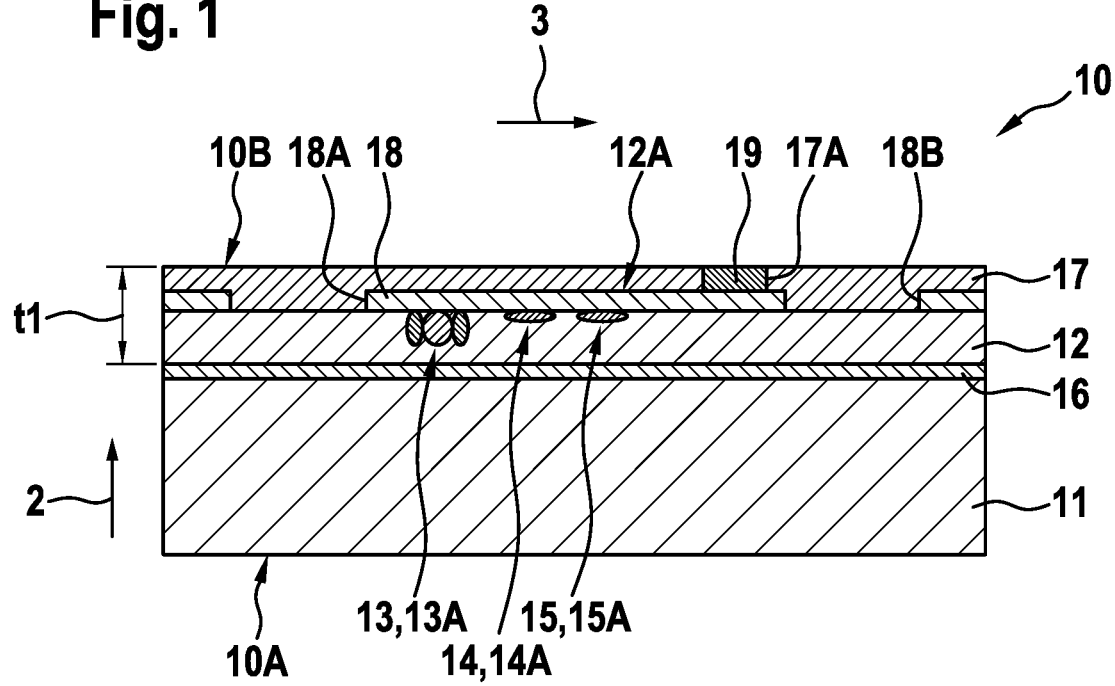
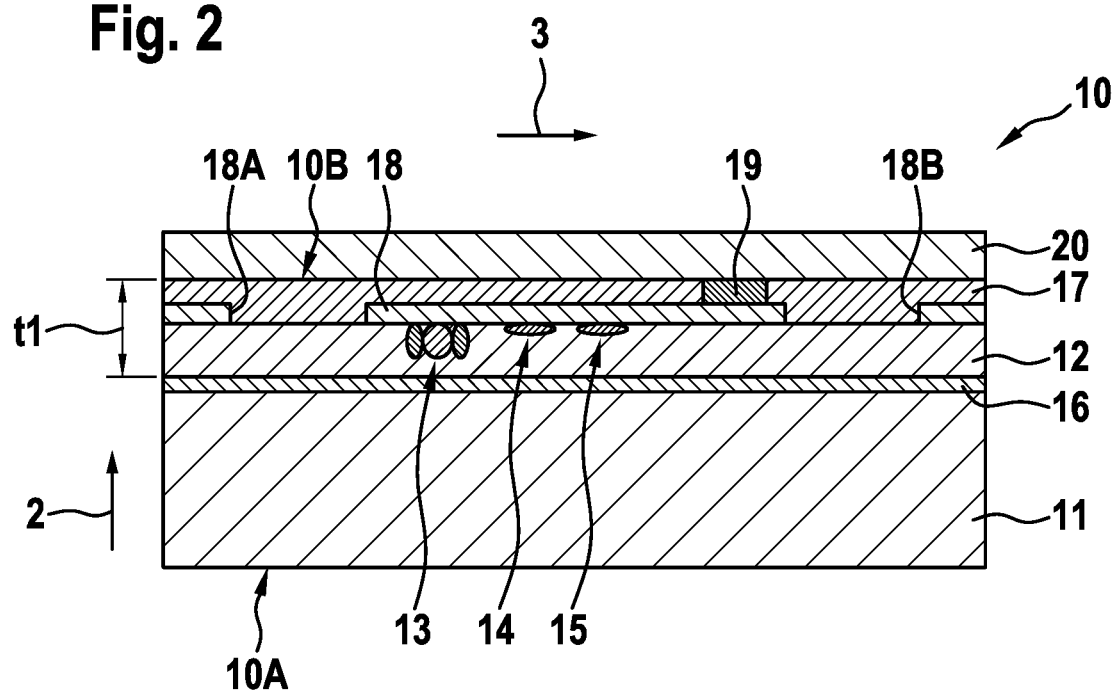

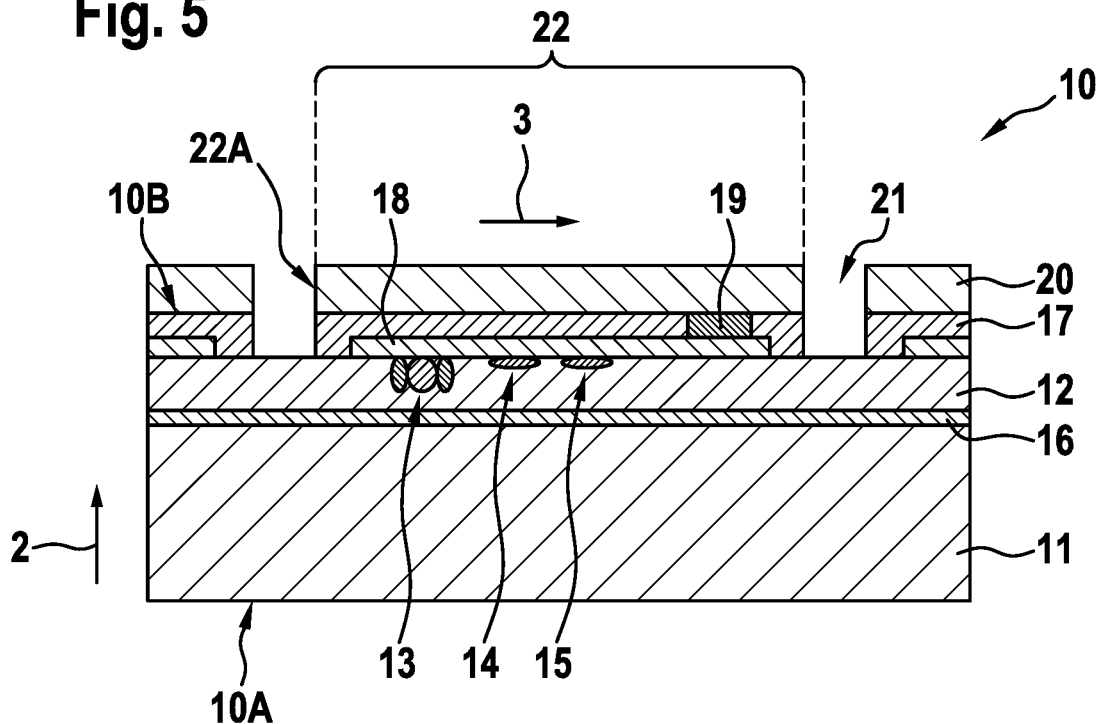
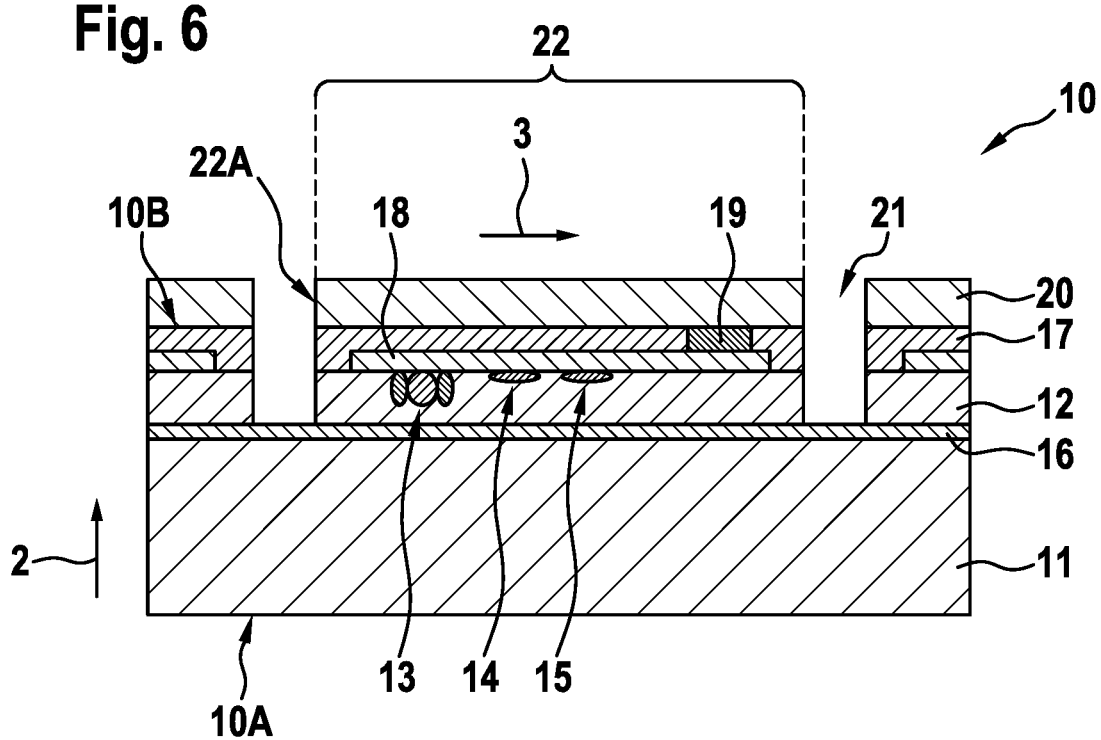

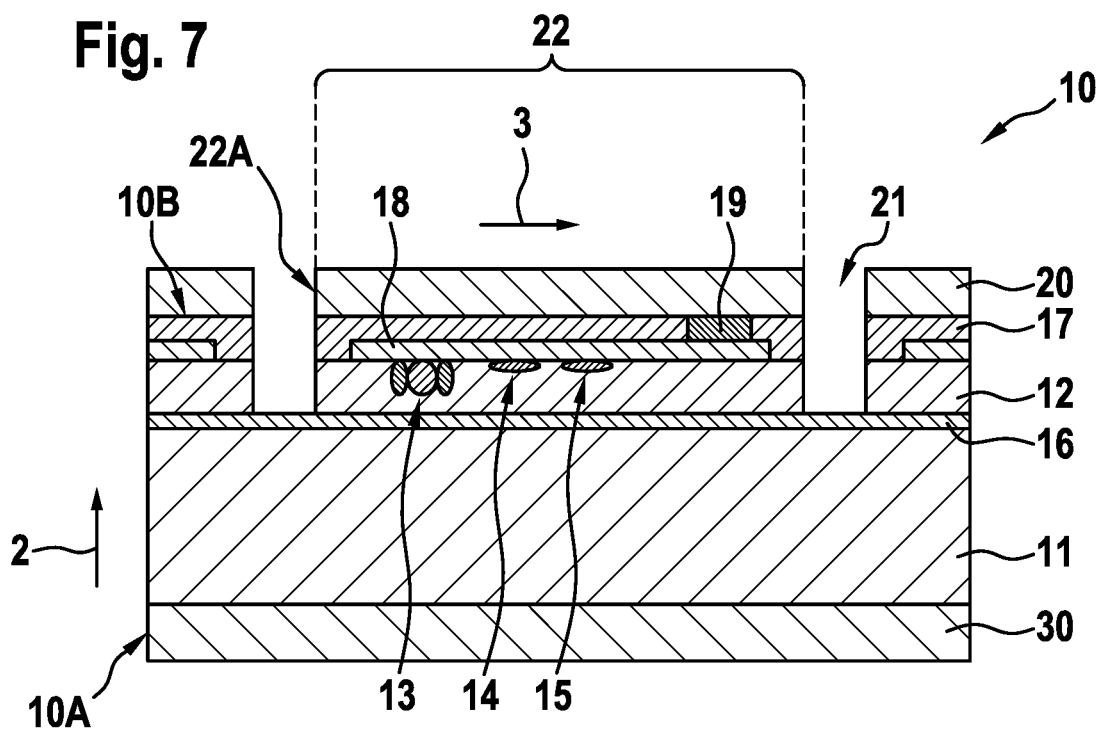
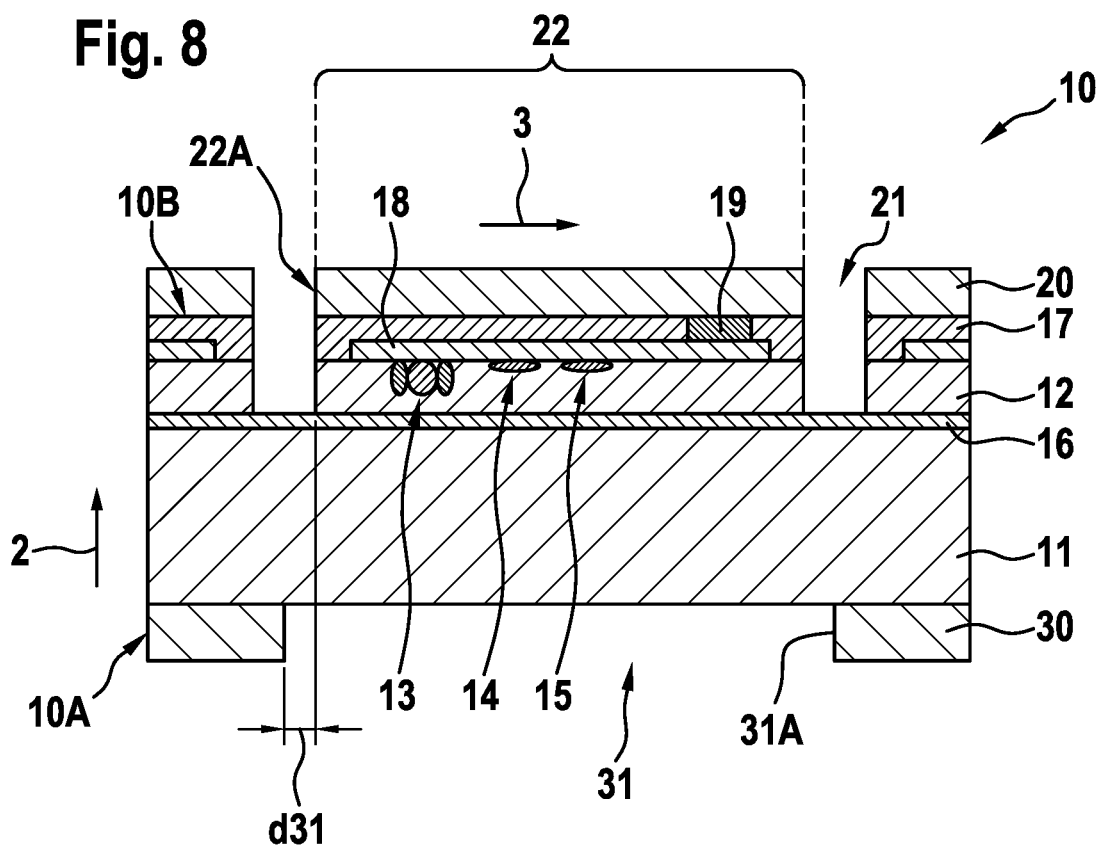

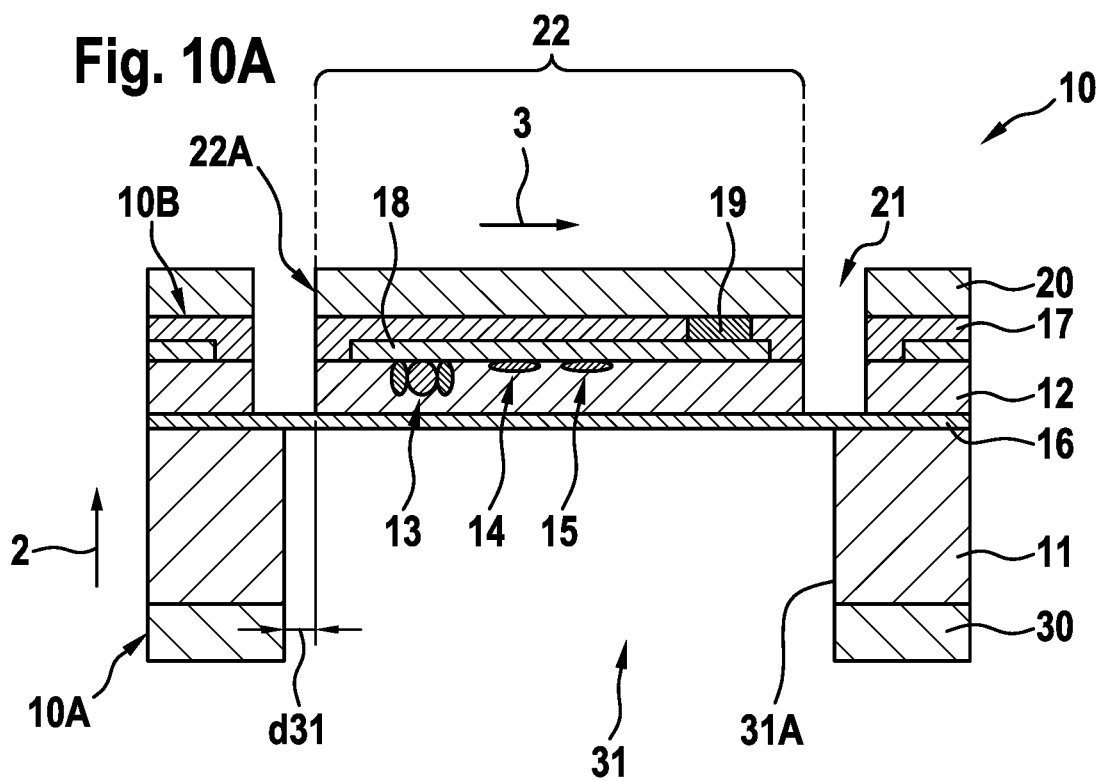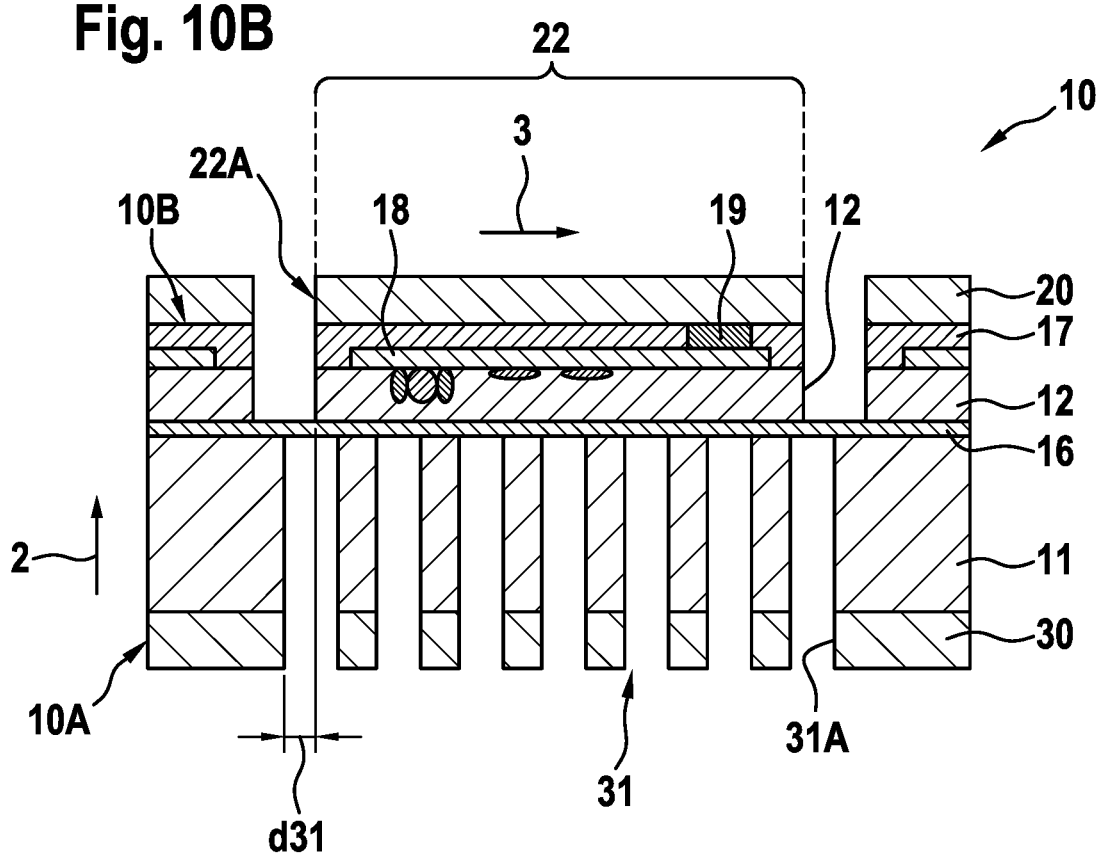

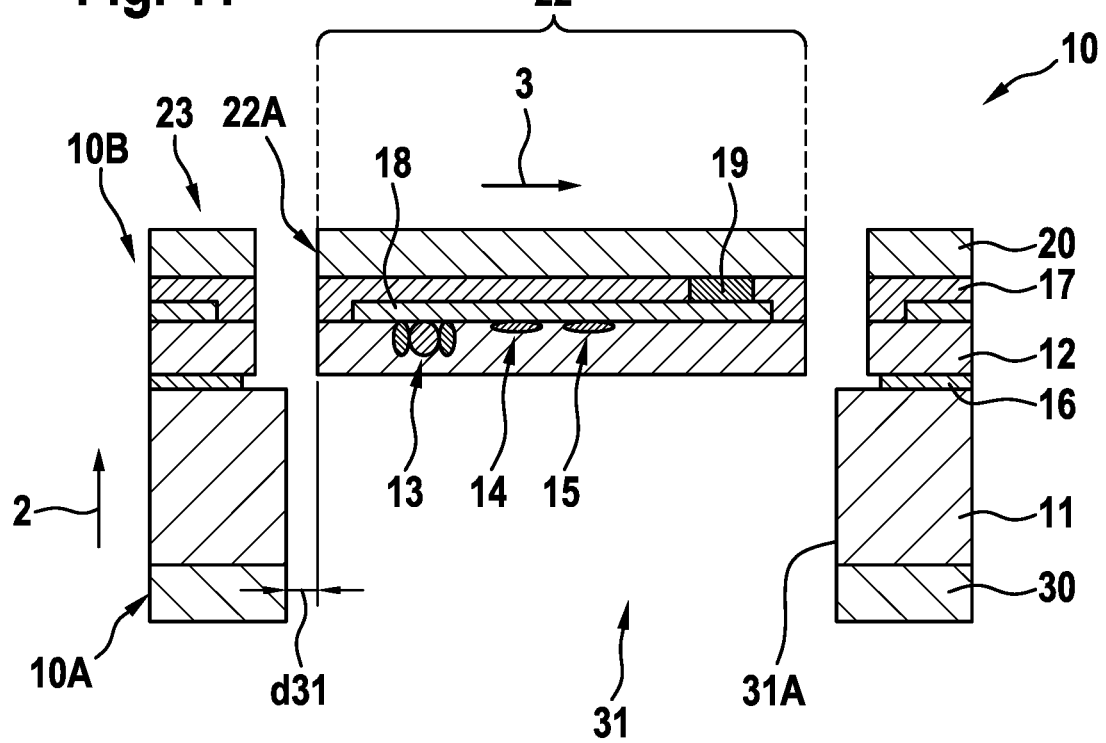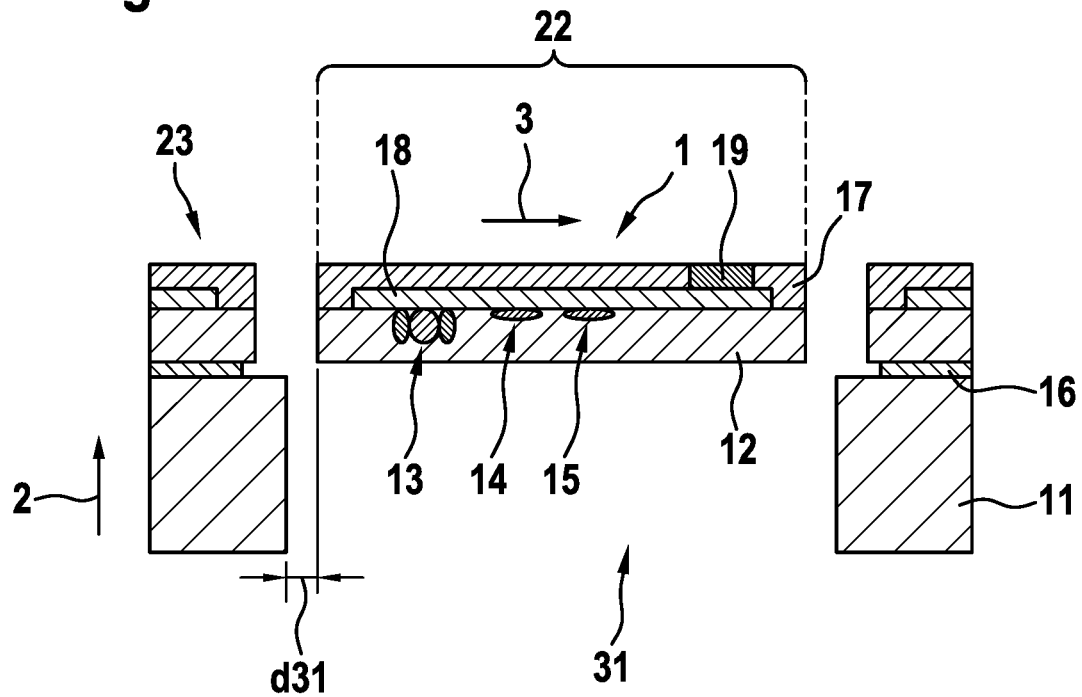

METHOD FOR MANUFACTURING A SEMICONDUCTOR DEVICE AND SEMICONDUCTOR DEVICE

RELATED APPLICATION INFORMATION

The present application claims priority to and the benefit of German patent application no. DE 10 2018 215 793.6, which was filed in Germany on Sep. 18, 2018, the disclosure of which is incorporated herein by reference.

FIELD OF THE INVENTION

The present invention relates to a method for manufacturing a semiconductor device and a semiconductor device.

BACKGROUND INFORMATION

There is a steadily growing need in semiconductor technology for ultra-thin chips, for example, in the areas of data storage, MEMS (short for "microelectromechanical systems"), integrated circuits, power electronics, etc.

Ultra-thin semiconductor chips, i.e., chips having a thickness in the range of 30 µm, are normally manufactured by initially applying functional elements such as, for example, electronic circuit elements, to a front side of a silicon wafer and laminating the front side. The silicon wafer is subsequently held on the front side and material is removed from the rear side by grinding until the desired thickness is achieved. Finally, the front side is delaminated again. Such a method is discussed, for example, in US 2008/0242052 A1.

SUMMARY OF THE INVENTION

According to one aspect of the present invention, a method is provided for manufacturing a semiconductor device such as, for example, a semiconductor chip, as specified herein. According to another aspect, a semiconductor device manufactured according to this method is provided, as specified herein.

In a first step of the method, a semiconductor substrate is provided that includes an SOI wafer and a passivation layer. The SOI wafer (SOI is an abbreviation of the expression "silicon-on-insulator") includes a carrier layer defining a rear side of the semiconductor substrate, a functional layer defining a front side of the semiconductor substrate and an insulation layer, for example, in the form of an oxide layer, situated between the carrier layer and the functional layer. The functional layer includes a functional area having electronic functional structures or functional components such as, for example, an epitaxial layer, bipolar, complementary metal oxide semiconductor (CMOS) components or DMOS components, doped areas for providing various functions such as piezoelectric effects or the like. The functional components are situated within a functional area, i.e., within a predetermined surface area of the functional layer. The functional components or the functional area are optionally covered by a dielectric layer. A passivation layer, which may be implemented, for example, by a nitride layer, may optionally also be applied to the functional layer. The substrate may be manufactured, in particular, via processing steps conventional in semiconductor technology.

In order to manufacture an ultra-thin semiconductor device from the substrate, the thickness of the semiconductor substrate is reduced. For this purpose, the method according to the present invention includes a sequence of masking steps and etching steps. Compared to the conventional grinding methods, this offers the advantage that mechanical stresses within the substrate are avoided or reduced. Damage to the functional layer is also prevented. Neither are a lamination and a delamination of the front side necessary, thus preventing foil remnants from remaining on the front side. The quality of the manufactured semiconductor device is improved as a result.

According to the present invention, a masking of the front side of the semiconductor substrate, in particular, takes place, a first mask opening being configured, which defines an interior area containing the functional area. The first mask opening may be configured, in particular, as a type of trench that surrounds the interior area.

The functional area and, if necessary, the optional passivation layer are then removed by etching the front side of the semiconductor substrate. In the process, the optional passivation layer and the underlying functional layer are removed in the area of the first mask opening in one or multiple successive etching steps with the aid of an etching method in order to expose the insulation layer located below the functional layer. Thus, the individual layers of the substrate are removed through the first mask opening by etching until the insulation layer is exposed. Etching in this case offers the advantage that no mechanical stresses or merely minimal mechanical stresses are introduced into the semiconductor substrate.

In additional steps, the rear side of the semiconductor substrate is masked, a second mask opening being configured, a circumferential edge of the second mask opening being spaced radially outward relative to an outer circumferential edge of the interior area. The second mask opening is thus configured in such a way that the interior area is located within the second mask opening.

The carrier layer and the insulation layer are also removed, at least in the area of the second mask opening, by etching the rear side of the semiconductor substrate to expose the interior area. In the process, therefore, the carrier layer is removed in the area of the second mask opening with the aid of an etching method to expose the insulation layer, and the insulation layer is removed, at least in the interior area, from the functional layer through the second mask opening with the aid of an etching method. Since the interior area in which the functional components are situated is located radially within the second mask opening, the interior area forming the semiconductor device is exposed as a result of the etching.

According to the present invention, the thickness of the substrate is reduced by etching methods that are carried out with the aid of masking methods through mask openings formed on the front side and rear side of the substrate. In this way, it is possible to dispense completely with mechanical machining steps for defining the thickness and the outer circumference of the semiconductor device, as a result of which the input of mechanical stresses and accompanying potential damage to the functional components are reliably avoided.

According to one specific embodiment of the method, the functional layer and, if necessary, the optional passivation layer together have a layer thickness, for example, in the range between 5 µm and 50 µm. The functional layer and the optional passivation layer, as well as, if necessary, the optional dielectric layer situated between the passivation layer and the functional layer, define the thickness of the semiconductor device to be manufactured. Since the carrier layer and the insulation layer are removed via etching, it is possible to manufacture a particularly thin semiconductor device.

According to another specific embodiment, it is provided that the first mask opening is configured with at least one web, which connects the interior area and an exterior area surrounding the interior area. Thus, a web or anchor is formed during the configuration of the mask opening, which interrupts the mask opening in the circumferential direction. In the area of the web, therefore, the underlying optional passivation layer and the functional layer are not removed during etching, so that a mechanical connection remains between the interior area and the exterior area, via which the interior area is retained after being exposed. This offers the advantage that a mechanical fixation is present when the carrier layer and the insulation are etched away in the area of the second mask opening.

It is possible, in particular, to separate the interior area from the exterior area after etching the rear side or after the removal of the insulation layer in the interior area by severing the web. This may take place, for example, by moving the interior area relative to the exterior area. This facilitates the further processing of the semiconductor device.

According to another specific embodiment, it is provided that the masking of the front side includes an application of a first photoresist layer and the first mask opening is formed in the first photoresist layer with the aid of a photolithographic method. The photoresist is applied, if necessary, to the optional passivation layer or to the functional layer. The underlying layer, i.e., the passivation layer or the functional layer, is exposed through the mask opening. Photolithographic methods offer the advantage that the profile of the mask opening and thus the outer circumference of the interior area may be shaped in a particularly flexible manner. Since the outer circumference of the interior area defines the outer circumference of the semiconductor device to be manufactured, there is great configuration flexibility in terms of the shape of the semiconductor device.

The first photoresist layer may be removed again after the etching of the front side, for example, via incineration or via plasma etching.

According to another specific embodiment, it is provided that the masking of the rear side includes an application of a second photoresist layer to the carrier layer, and the second mask opening is formed in the second photoresist layer with the aid of a photolithographic method to expose the carrier layer.

According to another specific embodiment, it is provided that the etching of the rear side of the semiconductor substrate includes an at least partial removal of the carrier layer within the circumferential edge of the second mask opening. The second mask opening is able to completely or fully expose the carrier layer within the circumferential edge. As an alternative, the carrier layer may be exposed merely in areas within the circumferential edge, for example, in a tile-like pattern. The carrier layer is entirely or partially removed during etching in accordance with the shape of the second mask opening, and as a result the underlying insulation layer is completely or partially exposed. In a merely partial removal of the carrier layer, the etching process for removing the carrier layer is advantageously accelerated.

According to another specific embodiment, the optional passivation layer and/or the insulation layer is/are removed with the aid of a dry etching method or with the aid of a wet etching method. Dry etching methods used may be, for example, electron beam etching, plasma etching methods, a CDE method ("CDE" is an abbreviation for "chemical dry etching"), RIE (short for "reactive ion beam etching") or similar methods. In the case of wet etching methods, a solution is applied to the layer to be removed, which disintegrates the layer as a result of a chemical reaction. Acidic or basic solutions, for example, may be used here, depending on the material of the layer.

According to another specific embodiment, the functional layer and/or the carrier layer is/are removed with the aid of an ion beam etching method, in particular, with the aid of a DRIE method or a RIE method. "RIE" is an abbreviation for "reactive ion beam etching". "DRIE is an abbreviation for "deep reactive ion etching". These methods offer the advantage that they may be very precisely carried out through the mask opening.

According to another aspect of the present invention, a semiconductor device is provided. The semiconductor device includes a functional layer, which includes a functional area having electronic functional structures, and optionally a passivation layer situated on the functional layer. A dielectric layer is optionally also situated between the optional passivation layer and the functional layer, which may be at least within the functional area. The semiconductor device may have a thickness, in particular, in the range between 5 µm and 50 µm. According to the present invention, the semiconductor device is manufactured by a method according to one of the previously described specific embodiments.

The present invention is explained in greater detail below with reference to the exemplary embodiments specified in the schematic figures of the drawings.

In the figures of the drawings, identical, functionally identical and identically operating elements, features and components—unless otherwise stated—are provided with the same reference numerals.

BRIEF DESCRIPTION OF THE DRAWINGS

FIG. 1 shows an exemplary sectional view of a substrate, which may be used as a base product for a method for manufacturing a semiconductor device according to the present invention.

FIG. 2 shows a sectional view of the substrate shown in FIG. 1 after the execution of a step of the method for manufacturing a semiconductor device according to one exemplary embodiment of the present invention.

FIG. 5 shows a sectional view of the substrate after the execution of another step of the method according to one exemplary embodiment of the present invention.

FIG. 6 shows a sectional view of the substrate after the execution of another step of the method according to one exemplary embodiment of the present invention.

FIG. 7 shows a sectional view of the substrate after the execution of another step of the method according to one exemplary embodiment of the present invention.

FIG. 8 shows a sectional view of the substrate after the execution of another step of the method according to one exemplary embodiment of the present invention.

FIG. 10A shows a sectional view of the substrate depicted in FIG. 8 after the execution of another step of the method according to one exemplary embodiment of the present invention.

FIG. 10B shows a sectional view of the substrate after the execution of another step of the method according to another exemplary embodiment of the present invention.

FIG. 11 shows a sectional view of the substrate after the execution of another step of the method according to one exemplary embodiment of the present invention.

FIG. 12 shows a sectional view of the substrate after the execution of another step of the method according to one exemplary embodiment of the present invention.

DETAILED DESCRIPTION

Figure 3:
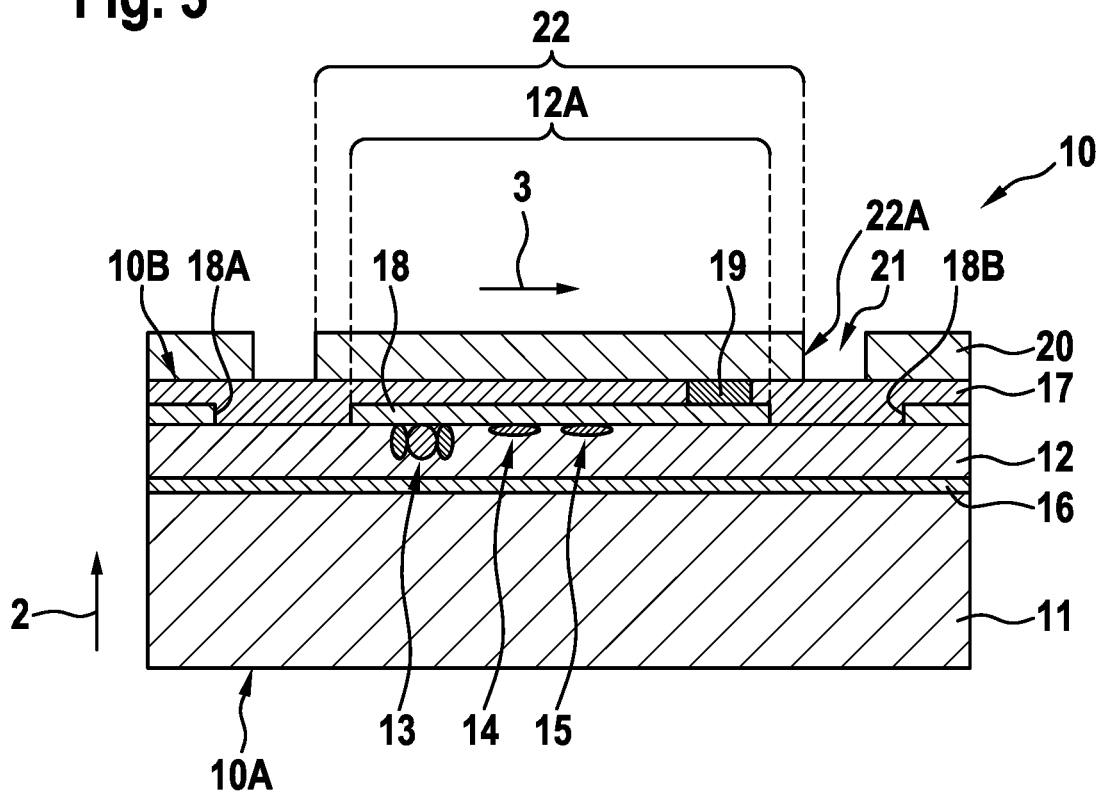
FIG. 3 shows a sectional view of the substrate after the execution of another step of the method according to one exemplary embodiment of the present invention.

In FIG. 1, a sectional view of a semiconductor substrate 10 is depicted by way of example, which is used as a base product for the method according to the present invention. As shown in FIG. 1, semiconductor substrate 10 includes an SOI wafer including a carrier layer 11, a functional layer 12 and an insulation layer 16, and an optional passivation layer 17 as well as an optional dielectric layer 18.

As is further schematically depicted in FIG. 1, one or multiple electronic functional components or functional structures 13, 14, 15 such as, for example, a CMOS element 13A or doped areas 14A, 15A are formed on functional layer 12. Functional structures 13, 14, 15 are situated within a functional area 12A on functional layer 12 with respect to a radial direction 3.

As is apparent in FIG. 1, semiconductor substrate 10 includes a layer structure, in which insulation layer 16 is situated between carrier layer 11 and functional layer 12 with respect to a thickness direction 2. Optional dielectric layer 18 is situated on a surface of functional layer 12, which is located facing away from insulation layer 16 with respect to thickness direction 2. Furthermore, openings 18A, 18B or a circumferential trough may be formed in dielectric layer 18 with respect to radial direction 3, which expose functional layer 12. Optional passivation layer 17 is situated on the surface of functional layer 12 located facing away from insulation layer 16, or may be situated on optional dielectric layer 18, as is depicted by way of example in FIG. 1. One or multiple recesses 17A, in which bond pads 19, for example, may be situated, is/are optionally provided in passivation layer 17. Functional layer 12 or, if necessary, optional passivation layer 17 defines a front side 10B of semiconductor substrate 10. Carrier layer 11 defines a rear side 10A of semiconductor substrate 10.

Carrier layer 11 and functional layer 12 may be silicon layers. Insulation layer 16 may be an oxide layer, for example, made of silicon dioxide. Passivation layer 17 may be formed, for example, from silicate glass, nitride or from similar materials. Silicon dioxide or titanium dioxide may be used as optional dielectric layer 18, for example.

Functional layer 12 and optional passivation layer 17 and, if necessary, optional dielectric layer 18 together have a layer thickness t1 in a range between 5 μm and 50 μm with respect to thickness direction 2. This layer thickness t1 corresponds to the thickness of semiconductor device 1 to be manufactured, as is depicted by way of example in FIG. 14.

FIGS. 2 through 14 show a method for manufacturing a semiconductor device 1, which may have a thickness, in particular, in the aforementioned range.

As is schematically shown in FIGS. 2 and 3, front side 10B of semiconductor substrate 10 is masked, a first mask opening 21 being configured. As is shown in FIG. 2, a first photoresist layer 20 may be applied to passivation layer 17, for example. Passivation layer 17 may, in particular, be provided over its entire area with first photoresist layer 20.

As is schematically depicted in FIG. 3, first mask opening 21 may be subsequently formed with the aid of a photolithographic method in first photoresist layer 20, in order to expose passivation layer 17 in the area of mask opening 21. First mask opening 21 defines an interior area 22, in which functional components 13, 14, 15 are situated. Functional area 12A is located, in particular, completely within interior area 22 with respect to radial direction 3, as is schematically depicted in FIG. 3. As is further apparent in FIG. 3, first mask opening 21 may be configured in such a way that the mask opening overlaps with optional openings 18A, 18B of optional dielectric layer 18.

Figure 4:
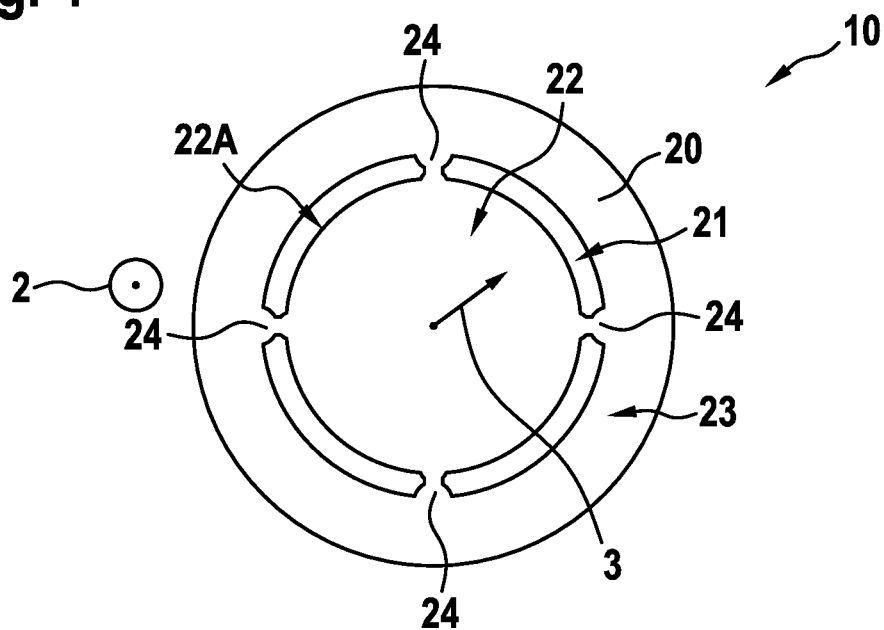
FIG. 4 shows a top view of a front side of the substrate shown in FIG. 3.

FIG. 4 shows a top view of front side 10B of substrate 10 or of first photoresist layer 20. As is depicted by way of example in FIG. 4, first mask opening 21 may, for example, have a circular configuration, so that an interior area 22 is formed with a circular outer circumference 22A. First mask opening 21 may, of course, also define other forms of outer circumference 22A, for example, a rectangular or generally polygonal outer circumference. As is further apparent in FIG. 4, first mask opening 21 may be configured with at least one web 24. Four webs 24 are depicted by way of example in FIG. 4. Webs 24 extend between interior area 22 and a surrounding exterior area 23. The at least one web 24, in particular, connects interior area 22 and exterior area 23. Passivation layer 17 is not exposed in the area of webs 24.

As is shown by way of example in FIGS. 5 and 6, passivation layer 17 and functional layer 12 are removed by etching front side 10B of semiconductor substrate 10. In this way, insulation layer 16 is exposed in the area of second mask opening 21. This may take place, in particular, in successive etching steps, which are explained below with reference to FIG. 5 and to FIG. 6.

As is depicted by way of example in FIG. 5, passivation layer 17 is initially removed in the area of first mask opening 21 with the aid of an etching method to expose functional layer 12. For this purpose, a dry etching method such as, for example, ion beam etching, plasma etching methods or RIE methods, or a wet etching method may be used. In the case of wet etching methods, a solution is applied to the layer to be removed, which disintegrates the layer as a result of a chemical reaction. Acidic or basic solutions may be used here, for example, depending on the material of the layer.

As is shown in FIG. 6, functional layer 12 is also removed in the area of first mask opening 21 with the aid of an etching method in order to expose insulation layer 16 in the area of first mask opening 21. This may take place with the aid of an ion beam etching method such as, for example, a DRIE method or a RIE method.

As shown in FIGS. 3 through 6, passivation layer 17 and functional layer 12 may be removed successively layer by layer in the area defined by first mask opening 21 via etching until insulation layer 16 is exposed in first mask opening 21. Passivation layer 17 and functional layer 12 remain in the area of optional webs 24 and thus connect interior area 22 and exterior area 23.

As is depicted by way of example in FIGS. 7, 8, 9A and 9B, rear side 10A of semiconductor substrate 10 is also masked, a second mask opening 31 being configured.

The masking of rear side 10A may, in particular, include an application of a second photoresist layer 30 to carrier layer 11 or to a rear side surface of carrier layer 11 located facing away from passivation layer 17, as is depicted by way of example in FIG. 7. Second mask opening 31 is configured in second photoresist layer 30, for example, with the aid of a photolithographic method. Carrier layer 11 or the rear side surface of carrier layer 11 is at least partially exposed through second mask opening 31. As is apparent in FIG. 8, second mask opening 31 is configured in such a way that a circumferential edge 31A of second mask opening 31, which delimits second mask opening 31 with respect to radial direction 3, is spaced radially outwardly by a distance d31 relative to exterior circumferential edge 22A of interior area 22. Circumferential edge 31A of second mask opening 31 may, in particular, extend in parallel to exterior circumferential edge 22A of interior area 22. Thus, interior area 22 is located completely within circumferential edge 31A of second mask opening 31 with respect to radial direction 3.

Figure 9A:
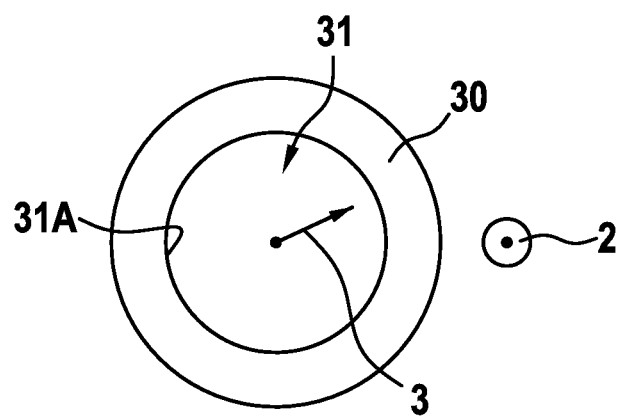
FIG. 9A shows a top view of the rear side of the substrate in FIG. 8, a second mask opening having been formed in a second photoresist layer in such a way that a carrier layer has been fully exposed within the second mask opening.

As is depicted by way of example in FIG. 9A, second mask opening 31 may be configured as a complete opening, entire second photoresist layer 30 being removed within circumferential edge 31A of second mask opening 31 and carrier layer 11 being fully exposed within circumferential edge 31A with respect to radial direction 3. Alternatively, second mask opening 31 may also be configured in such a way that second photoresist layer 30 is merely partially removed within circumferential edge 31A of second mask opening 31 and carrier layer 11 is merely partially exposed, as depicted by way of example in FIG. 9B.

Figure 9B:
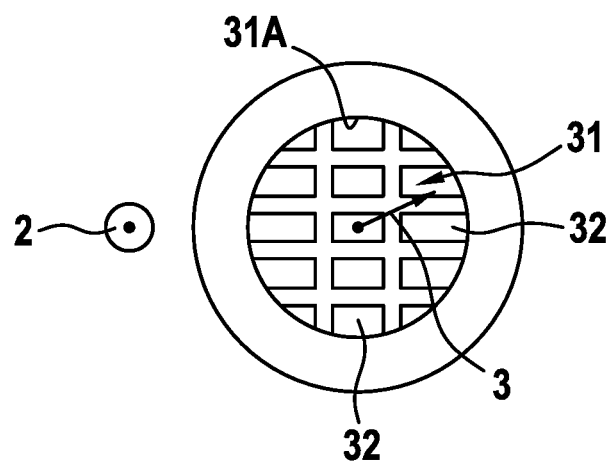
FIG. 9B shows a top view of the rear side of the substrate after the execution of a step of the method according to another exemplary embodiment of the present invention, the second mask opening having been formed in the second photoresist layer in such a way that the carrier layer has been partially exposed within the second mask opening.

In FIG. 9B, it is shown by way of example that second photoresist layer 30 is removed in individual fields 32 in a tile-like or grid-like pattern within circumferential edge 31A of second mask opening 31. In FIGS. 9A and 9B, circumferential edge 31A of second mask opening 31 is depicted by way of example as circular.

As is schematically depicted in FIGS. 10A, 10B and 11, carrier layer 11 and insulation layer 16 are removed in a further step at least in the area of second mask opening 31 by etching rear side 10A of semiconductor 10. Interior area 22 is exposed as a result, as is apparent, in particular, in FIG. 11.

As is depicted by way of example in FIGS. 10A and 10B, carrier layer 11 may initially be removed in the area of second mask opening 31 with the aid of an etching method in order to expose insulation layer 16 in the area of second mask opening 31. This may take place, for example, with the aid of a plasma etching method, in particular, with the aid of a DRIE method or of a RIE method. In FIG. 10A, starting from the situation in which second photoresist layer 30 has been completely removed from within circumferential edge 31A, carrier layer 11 has also been completely removed from within circumferential edge 31A. In FIG. 10B, starting from the situation shown in FIG. 9B, in which second photoresist layer 30 has been merely partially removed from within circumferential edge 31A, carrier layer 11 has also been merely partially removed where it has been exposed.

As is apparent in FIGS. 10A and 10B, distance d31 arising between circumferential edge 31A and exterior circumference 22A of interior area 22 is bridged by insulation layer 16.

As is shown in FIG. 11, insulation layer 16 may also be removed from functional layer 12 at least in interior area 22 through second mask opening 31 with the aid of an etching method. As is shown by way of example in FIG. 11, insulation layer 16 is etched away from the side of second mask opening 31 within circumferential edge 31A of interior area 22 with respect to radial direction 3, so that functional layer 12 is exposed at least in interior area 22. Insulation layer 16 may be removed with the aid of a dry etching method or with the aid of a wet etching method. By removing insulation layer 16, the physical coherence between interior area 22 and exterior area 23, except for optional webs 24, is neutralized, and interior area 22 is exposed as a result, since outer circumference 22A of interior area 22 is located within circumference 31A of second mask opening 31 with respect to radial direction 3.

First photoresist layer 20 is optionally also removed from passivation layer 17 in interior area 22, as is shown by way of example in FIG. 12. For this purpose, first photoresist layer 20 may, for example, be incinerated or be removed by plasma etching.

Figure 13:
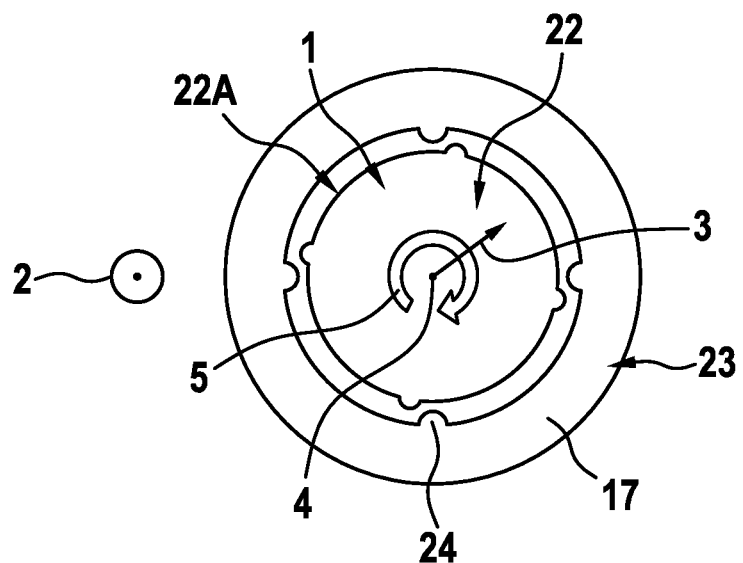
FIG. 13 shows a top view of the front side of the substrate during the implementation of another method step, in which a semiconductor device manufactured with the aid of the method is separated from the substrate.

In FIG. 13, it is shown by way of example, that interior area 22 is separated in interior area 22 from exterior area 23 after removal of insulation layer 16 by severing optional webs 24. This may take place, for example, by a rotation of interior area 22 relative to exterior area 23 about a rotation axis 4 extending in the depth direction, as is depicted symbolically by arrow 5 in FIG. 13. Webs 24 break as a result of the relative movement. Once webs 24 are severed, semiconductor device 1 may be removed from substrate 10, as is depicted symbolically by arrow 6 in FIG. 14.

Figure 14:
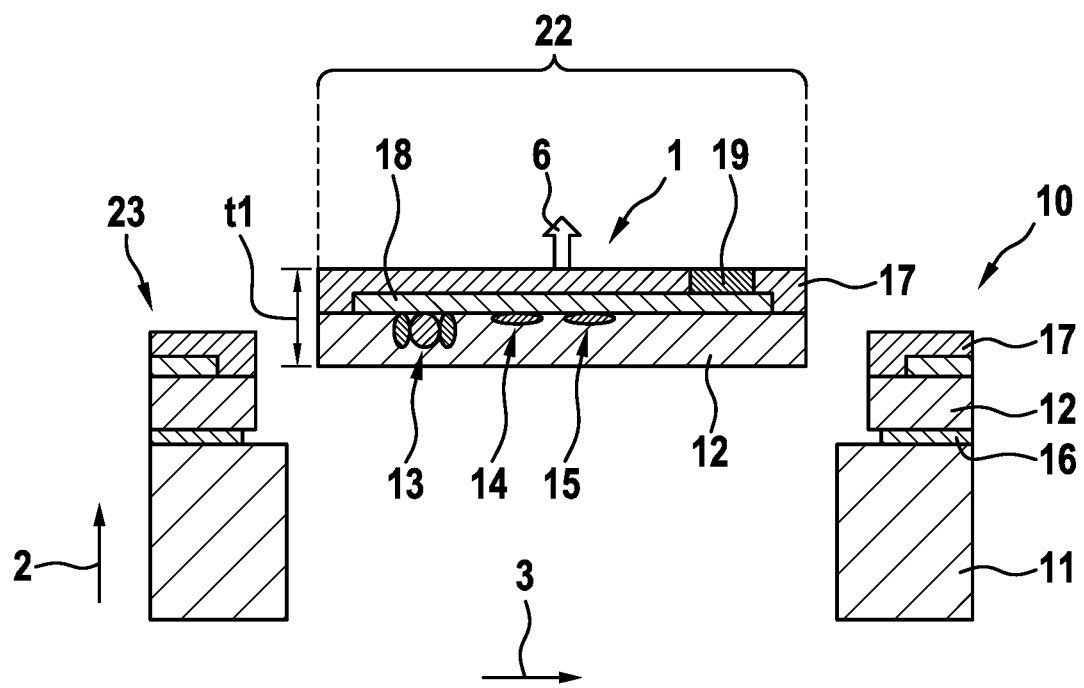
FIG. 14 shows a sectional view of the substrate or of the semiconductor device during another method step.

Semiconductor device 1 obtained by the aforementioned method is depicted by way of example in FIG. 14. Semiconductor device 1 in this case is formed by interior area 22 of semiconductor substrate 10, which has been separated from exterior area 23. Thickness t1 of semiconductor device 1 is defined by the thickness of functional layer 12, if necessary, of optional passivation layer 17 and, if necessary, of optional dielectric layer 18 and may, in particular, be in a range between 5 μm and 50 μm.

What is claimed is:

1. A method for manufacturing a semiconductor device, the method comprising:
    providing a semiconductor substrate, including a silicon-on-insulator (SOI) wafer having a carrier layer defining a rear side, a functional layer defining a front side and an insulation layer situated between the carrier layer and the functional layer, the functional layer including a functional area having electronic functional structures;
    masking the front side of the semiconductor substrate, a first mask opening being configured, which delimits an interior area containing the functional area;
    removing a portion of the functional layer which circumferentially surrounds the interior area containing the functional area including the electronic functional structures by etching the front side of the masked semiconductor substrate, the etching of the front side exposing the insulation layer while leaving the interior area containing the functional area including the electronic functional structures intact;
    masking the rear side of the semiconductor substrate, a second mask opening being configured, a circumferential edge of the second mask opening being spaced outwardly relative to an outer circumferential edge of the interior area; and removing the carrier layer and the insulation layer at least in the area of the second mask opening by etching the rear side of the semiconductor substrate to expose the interior area.

2. The method of claim 1, wherein the functional layer has a layer thickness in a range between 5 µm and 50 µm.

3. The method of claim 1, wherein the first mask opening is configured with at least one web, which connects the interior area and a surrounding exterior area.

4. The method of claim 3, wherein, once the rear side is etched, the interior area is separated from the exterior area by severing the at least one web.

5. The method of claim 1, wherein the masking of the front side includes an application of a first photoresist layer, and the first mask opening is formed in the photoresist layer with a photolithographic process.

6. The method of claim 1, wherein the masking of the rear side includes an application of a second photoresist layer to the carrier layer and the second mask opening is formed in the second photoresist layer with a photolithographic process to expose the carrier layer.

7. The method of claim 1, wherein the etching of the rear side of the semiconductor substrate includes an at least partial removal of the carrier layer within the circumferential edge of the second mask opening.

8. The method of claim 1, wherein the insulation layer is removed with a dry etching process or with a wet etching process.

9. The method of claim 1, wherein the portion of the functional layer and/or the carrier layer is removed with an ion beam etching process.

10. The method of claim 1, wherein the functional layer and/or the carrier layer is removed with a deep reactive ion etching (DRIE) process or a reactive ion beam etching (RIE) process.

11. The method as recited in claim 1, wherein the electronic structures include a complementary metal oxide semiconductor (CMOS) element and/or a doped area.

* * * * *